(12) United States Patent
Midori et al.

(10) Patent No.: US 10,317,446 B2
(45) Date of Patent: **\*Jun. 11, 2019**

(54) RADIATED EMISSION MEASURING DEVICE

(71) Applicant: TDK CORPORATION, Tokyo (JP)

(72) Inventors: Masataka Midori, Tokyo (JP); Hiroshi Kurihara, Tokyo (JP)

(73) Assignee: TDK CORPORATION, Tokyo (JP)

( * ) Notice: Subject to any disclaimer, the term of this patent is extended or adjusted under 35 U.S.C. 154(b) by 32 days.

This patent is subject to a terminal disclaimer.

(21) Appl. No.: 15/446,747

(22) Filed: Mar. 1, 2017

(65) Prior Publication Data

US 2017/0276712 A1    Sep. 28, 2017

(30) Foreign Application Priority Data

Mar. 28, 2016   (JP) .................... 2016-064308

(51) Int. Cl.
*G01R 29/08* (2006.01)

(52) U.S. Cl.
CPC ..... *G01R 29/0892* (2013.01); *G01R 29/0878* (2013.01)

(58) Field of Classification Search
CPC .... G01N 22/04; G01N 22/00; G01R 27/2635; G01R 29/0814; G01R 29/0892; G01R 29/0878; G01R 27/04
See application file for complete search history.

(56) References Cited

U.S. PATENT DOCUMENTS 4,201,987 A  5/1980  Tricoles
6,456,070 B1  9/2002  Kazama et al.
(Continued)

FOREIGN PATENT DOCUMENTS

| JP | H01-312472 A | 12/1989 |
| JP | H10-62467 A | 3/1998 |
| JP | 2000206163 A | 7/2000 |
| JP | 2003-004783 A | 1/2003 |
| JP | 2003-318634 A | 11/2003 |

(Continued)

OTHER PUBLICATIONS

Hirakawa, Hiromasa, "New Physics Series 2: Electromagnetism", 1st Edition, 16th Printing, Baifukan Co., Ltd., Japan, pp. 47-48, Dec. 10, 1983.

(Continued)

*Primary Examiner* — Jermele M Hollington
*Assistant Examiner* — Suresh K Rajaputra
(74) *Attorney, Agent, or Firm* — Oliff PLC

(57) ABSTRACT

A radiated emission measuring device includes: an electric field measuring device and an arithmetic processing unit. The arithmetic processing unit performs: a first arithmetic process of creating at least one of an electric field distribution and an electric field strength distribution of the plurality of measurement points measured by the electric field measuring device and inputting zero to at least one of an electric field and electric field strengths at a certain point between two neighboring measurement points; a second arithmetic process of applying a digital low pass filter to at least one of the electric field distribution and the electric field strength distribution obtained in the first arithmetic process; and a third arithmetic process of specifying a position at a maximum electric field strength from at least one of an electric field distribution and an electric field strength distribution obtained in the second arithmetic process.

2 Claims, 7 Drawing Sheets

(56) References Cited

U.S. PATENT DOCUMENTS

| | | |
|---|---|---|
| 8,188,928 B2 | 5/2012 | Lin |
| 2003/0006786 A1 | 1/2003 | Kazama et al. |
| 2003/0226892 A1 | 12/2003 | Arimura |
| 2006/0033510 A1 | 2/2006 | Kazama et al. |
| 2006/0220635 A1 | 10/2006 | Kazama et al. |
| 2007/0024293 A1* | 2/2007 | Kosaka ............... G01R 31/001 324/754.21 |
| 2009/0006011 A1* | 1/2009 | Kazawa ............. G01R 29/0871 702/57 |
| 2010/0277157 A1* | 11/2010 | Tani .................... G01R 31/002 324/72 |
| 2012/0050118 A1* | 3/2012 | Teshirogi ............... G01R 29/10 343/703 |
| 2013/0249762 A1 | 9/2013 | Grelier |
| 2015/0042309 A1* | 2/2015 | Kurihara ........... G01R 29/0821 324/76.11 |

FOREIGN PATENT DOCUMENTS

| | | |
|---|---|---|
| JP | 200469372 A | 3/2004 |
| JP | 2006201007 A | 8/2006 |
| JP | 2006-258756 A | 9/2006 |
| JP | 2007-081647 A | 3/2007 |

OTHER PUBLICATIONS

Jun. 24, 2015 Office Action issued in Japanese Patent Application No. 2013-166651.

Masataka Midori et al., "A Fundamental Study on Estimation of 3 m Test-range from Near-field Electromagnetic Field Measurement," The Institute of Electronics, Information and Communication Engineers (IEICE) Technical Report, EMCJ2013-11 2013, pp. 7-12 (with abstract).

* cited by examiner

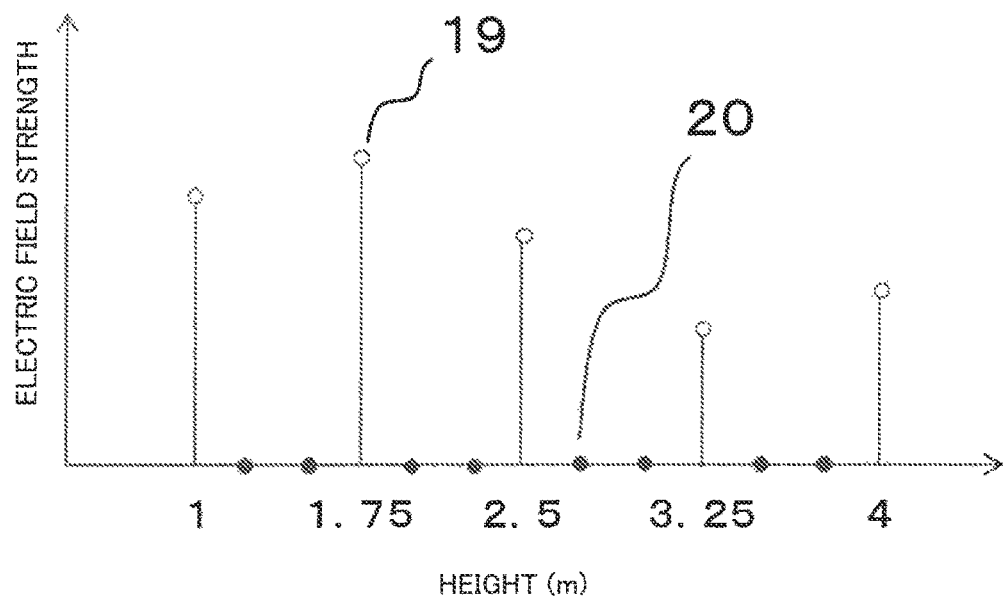
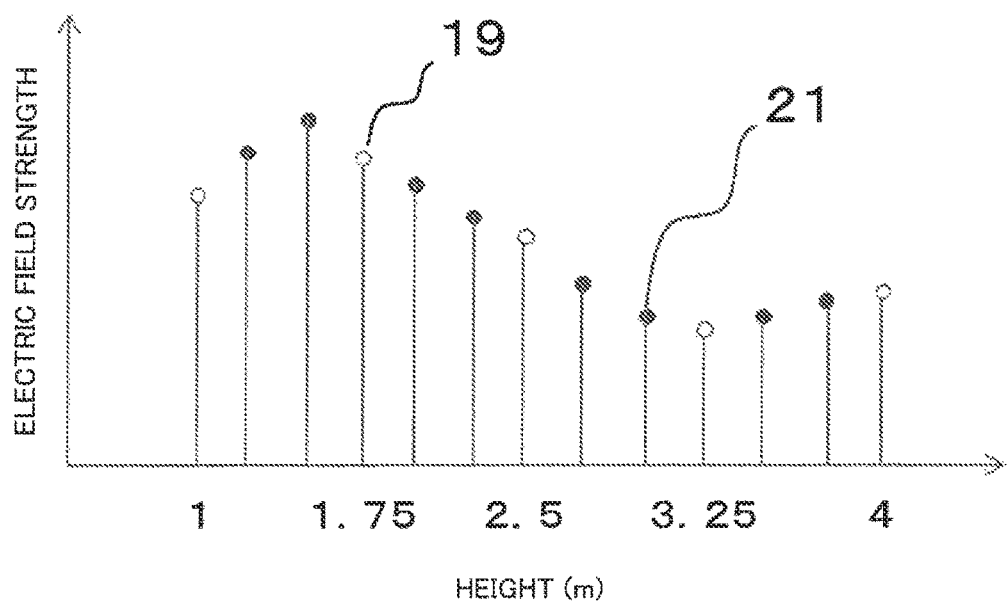

RADIATED EMISSION MEASURING DEVICE

BACKGROUND OF THE INVENTION

Field of the Invention

The present invention relates to a radiated emission measuring device.

Priority is claimed on Japanese Patent Application No. 2016-064308, filed Mar. 28, 2016, the content of which is incorporated herein by reference.

Description of Related Art

Tests in which radiated emissions radiated from electronic devices or the like are measured depend on internationally determined test conditions and methods. In such test methods, a height of a receiving antenna is changed and an angle of a test sample is changed at a position which is a predetermined distance away from a radiation source of radiated emissions. Also, positions at which strengths of electric fields (electric field strengths) are maximized are found, and a final test is performed at such positions. An example of a radiated emission measuring device is disclosed in, for example, Japanese Unexamined Patent Application Publication No. 2006-258756.

SUMMARY OF THE INVENTION

In order to find positions at which maximum electric field strengths are obtained, at least one of electric fields and electric field strengths for every antenna height and angle of a test sample need to be measured. For this reason, the number of measurement points is significantly increased. If measurement of radiated emissions of a frequency, range of 30 MHz to 1000 MHz of an information communication device is performed as an example, an antenna height and an angle of a test sample need to be changed to be 1 m to 4 m and 0 to 360°, respectively. For example, when measurement is performed at an interval of 1 cm and an interval of 1°, there is a concern in that the number of measurement points is increased to 140,000 points and a measurement time is significantly increased.

There is a concern in that it takes a lot of time to find an antenna height and a test sample angle at which maximum electric field strengths are obtained (hereinafter referred to as a maximum electric field strength position as described above. For this reason, in general measurement, a technique in which a measurement engineer measures at least one of electric fields and electric field strengths, changes an antenna height and an angle of a test sample, and identifies a maximum electric field strength position depending on his/her intuition and experience, and thus a measurement time is shortened has been used.

However, since a measurement result depends on the skill of the measurement engineer in such a technique, there is a concern in that training needs significant expense and time to guarantee the skills of the measurement engineer.

The present invention was made in view of such circumstances and the present invention is for the purpose of providing a radiated emission measuring device which identifies a maximum electric field strength position in a short period of time regardless of the skills of a measurement engineer.

In a radiated emission measuring device related to an aspect of the present invention, a radiated emission measuring device configured to measure an electric field distribution of measurement points formed on a virtual surface surrounding a radiation source of electromagnetic waves includes: an electric field measuring device and an arithmetic processing unit. The electric field measuring device includes: an antenna configured to detect at least one of electric fields and electric field strengths; a position adjustment unit configured to change a position of the antenna relative to the radiation source; and a controller configured to perform a first operation of setting a plurality of measurement points on the virtual surface and a second operation of measuring at least one of the electric fields and the electric field strengths at a predetermined frequency at the plurality of measurement points using the antenna while controlling the position adjustment unit. The arithmetic processing unit is constituted to perform: a first arithmetic process of creating at least one of an electric field distribution and an electric field strength distribution of the plurality of measurement points measured in the second operation and inputting zero to at least one of an electric field and electric field strengths at a certain point between two neighboring measurement points in at least one of the electric field distribution and the electric field strength distribution; a second arithmetic process of applying a digital low pass filter in which the predetermined frequency is a cutoff frequency to at least one of the electric field distribution and the electric field strength distribution obtained in the first arithmetic process; and a third arithmetic process of identifying a position at a maximum electric field strength from at least one of an electric field distribution and an electric field strength distribution obtained in the second arithmetic process.

The plurality of measurement points may be arranged to be disposed in two directions intersecting on the virtual surface, and a distance between two neighboring measurement points in the two directions may be ½ or less of a wavelength of a frequency to be measured.

A position at which a maximum electric field strength is obtained is specified from at least one of an electric field distribution and an electric field strength distribution obtained through the first and second arithmetic processes so that the number of measurement points necessary for obtaining a maximum electric field strength position can be significantly reduced. Thus, the maximum electric field strength position can be specified in a short period of time regardless of the skills of a measurement engineer.

BRIEF DESCRIPTION OF THE DRAWINGS

FIG. 7 is an explanatory diagram showing that zero is interpolated into at least one of electric fields and electric field strengths between two neighboring measurement points in the method of estimating the maximum electric field strength position of the radiated emission measuring device related to the embodiment of the present invention.

FIG. 8 is an explanatory diagram for describing results when a digital low pass filter is adapted for at least one of an electric field distribution and an electric field strength distribution in the method of estimating the maximum electric field strength position of the radiated emission measuring device related to the embodiment of the present invention.

DETAILED DESCRIPTION OF THE INVENTION

[Estimation Principle]

Hereinafter, an outline of an estimation principle related to an embodiment of the present invention will be described. If an electric field at an arbitrary point is represented by plane wave spectrum representation, the electric field can be represented as the following Expression (1).

$$E(x,y,z)=\iint\{A(k_x,k_y)\exp(-jk_z z)\}\exp(-jk_x x-jk_y y)dk_x dk_y \quad (1)$$

$A(k_x,k_y)$ is an amplitude of plane waves and $k_x, k_y, k_z$ is a wave number.

Expression (1) is considered to be a two-dimensional (2D) Fourier transform of $A(k_x,k_y)\exp(-jk_z z)$. Thus, it can be seen that an electric field distribution obtained at a certain frequency is subject to bandwidth limitation at the frequency.

Thus, if an electric field distribution which a spatial resolution is ½ or less of a wavelength of electromagnetic waves can be obtained, it can be seen that the electric field distribution can be completely reproduced by a sampling theorem. For this reason, if the electric field distribution can be measured at measurement points of ½ or less of the wavelength of the electromagnetic waves, maximum electric field strength positions can be specified from a restored electric field distribution.

Hereinafter, an embodiment of the present invention will be described in detail.

Figure 1:
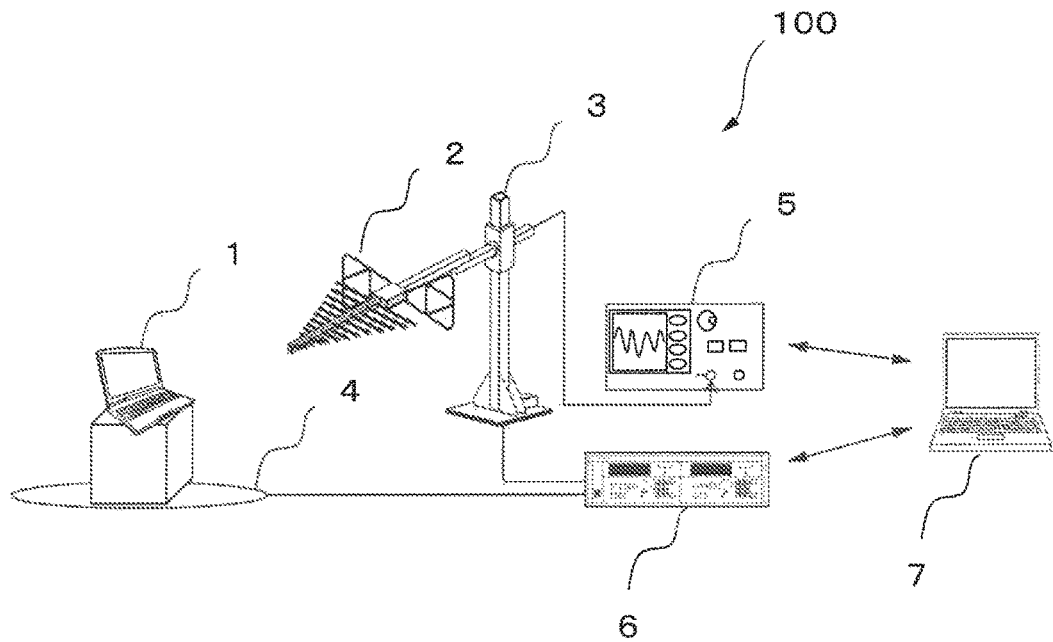
FIG. 1 is a schematic diagram showing a radiated emission measuring device related to an embodiment of the present invention.
Figure 2:
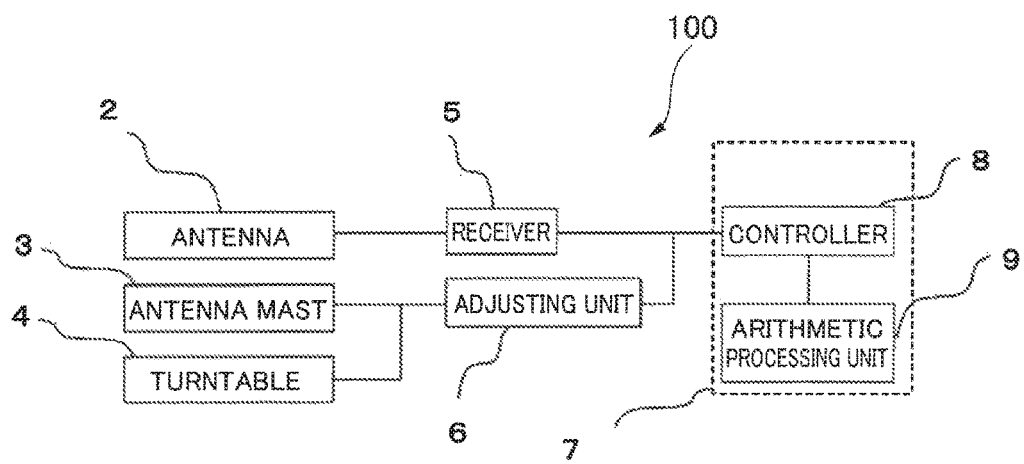
FIG. 2 is a block diagram showing main constituent elements of the radiated emission measuring device related to the embodiment of the present invention.

First, referring to FIGS. 1 and 2, a radiated emission measuring device 100 related to the embodiment of the present invention will be described. FIG. 1 is a schematic diagram showing the radiated emission measuring device related to the embodiment of the present invention. FIG. 2 is a block diagram showing main constituent elements of the radiated emission measuring device 100 related to this embodiment. The radiated emission measuring device 100 related to this embodiment includes a receiving antenna (an antenna) 2, an antenna mast 3 configured to move the receiving antenna 2 upward/downward, and a turntable 4 capable of rotating a test sample (a radiation source) 1 disposed thereon. Furthermore, the radiated emission measuring device 100 includes a receiver 5, an adjusting unit 6, and a computer 7. The receiver 5 measures at least one of electric fields and electric field strengths. The adjusting unit 6 adjusts a height of the antenna mast 3 and an angle of rotation of the turntable 4. The computer 7 includes a controller 8 configured to control the receiver 5 and the adjusting unit 6 and an arithmetic processing unit 9 configured to specify a maximum electric field strength position using measured values. The antenna mast 3 and the turntable 4 are connected to the adjusting unit 6, for example, through communication cables. The receiver 5 and the adjusting unit 6 are connected to the computer 7, for example, through communication cables.

As described above, the computer 7 includes the controller 8 configured to control measurement and the arithmetic processing unit 9. A process performed by the arithmetic processing unit 9 will be described in detail later. In this embodiment, the controller 8 and the arithmetic processing unit 9 are realized through the computer 7. Note that a constitution of the antenna mast 3, the turntable 4, and the adjusting unit 6 is not limited as long as a position of the receiving antenna 2 relative to a radiation source 1 can be changed and may be also referred to as a position adjusting unit in some cases. As the constitution of the position adjustment unit, for example, a moving unit, which is constituted of wheels (not shown) mounted on the base portion of the antenna mast 3, for moving the antenna mast 3 in the horizontal direction can be used. By this constitution, it is possible to change the angle of the antenna 2 relative to the radiation source 1 without the turntable.

Furthermore, a constitution of both of the receiver 5 and the controller 8 may be simply referred to as a controller in some cases.

Figure 3:
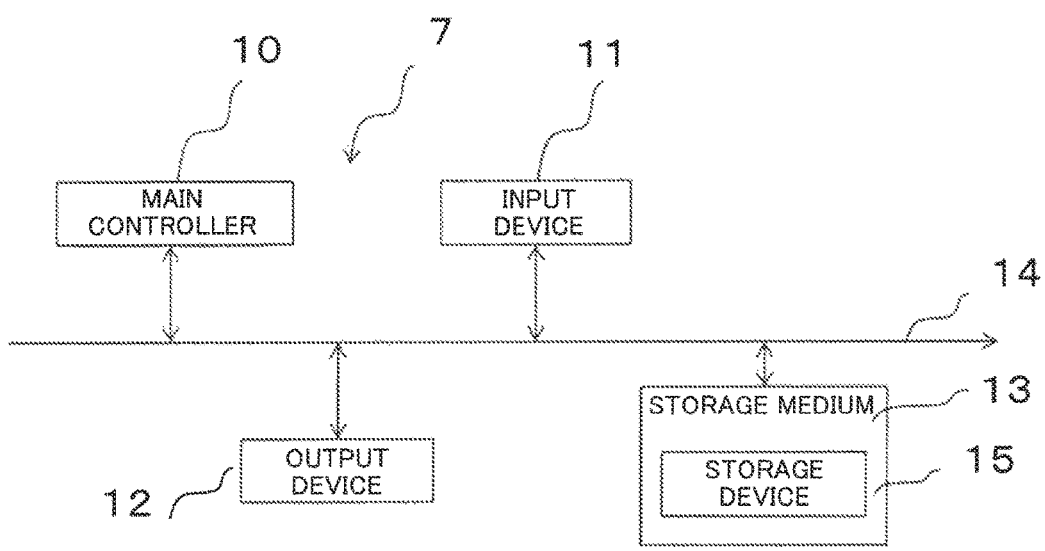
FIG. 3 is a block diagram showing a constitution of a computer of FIG. 2.

FIG. 3 is a block diagram showing a hardware constitution of the computer 7 in FIG. 2. The computer 7 includes a main controller 10, an input device 11, an output device 12, a storage medium 15, and a bus 14 configured to connect a main controller 10, an input device 11, an output device 12, and a storage device 15 to each other. The main controller 10 has a central processing unit (CPU) and a random access memory (RAM). The input device 11 is used to perform an input of information necessary for an operation of the radiated emission measuring device 100 or instructions for various operations and is, for example, a keyboard. The output device 12 is used to output (including displaying) various information associated with an operation of the radiated emission measuring device and is, for example, a display element such as a liquid crystal monitor.

Although any form of storage device may be used as long as the storage device can store information, a storage device 13 may be, for example, a hard disk device or an optical disc device. Furthermore, the storage device 13 records information on the computer-readable storage medium 15 and reproduces information from the storage medium 15. The storage medium 15 is, for example, a hard disk or an optical disc. The storage medium 15 may be a storage medium configured to record a program used to realize the controller 8 and the arithmetic processing unit 9 shown in FIG. 2.

The main controller 10 can execute, for example, the program recorded on the storage medium 15 of the storage device 13 and implement both control using the controller 8 and processing using the arithmetic processing unit 9 which are shown in FIG. 2. In other words, the controller 8 and the arithmetic processing unit 9 shown in FIG. 2 are not physically separate elements but elements distinguishable in software.

Figure 4:
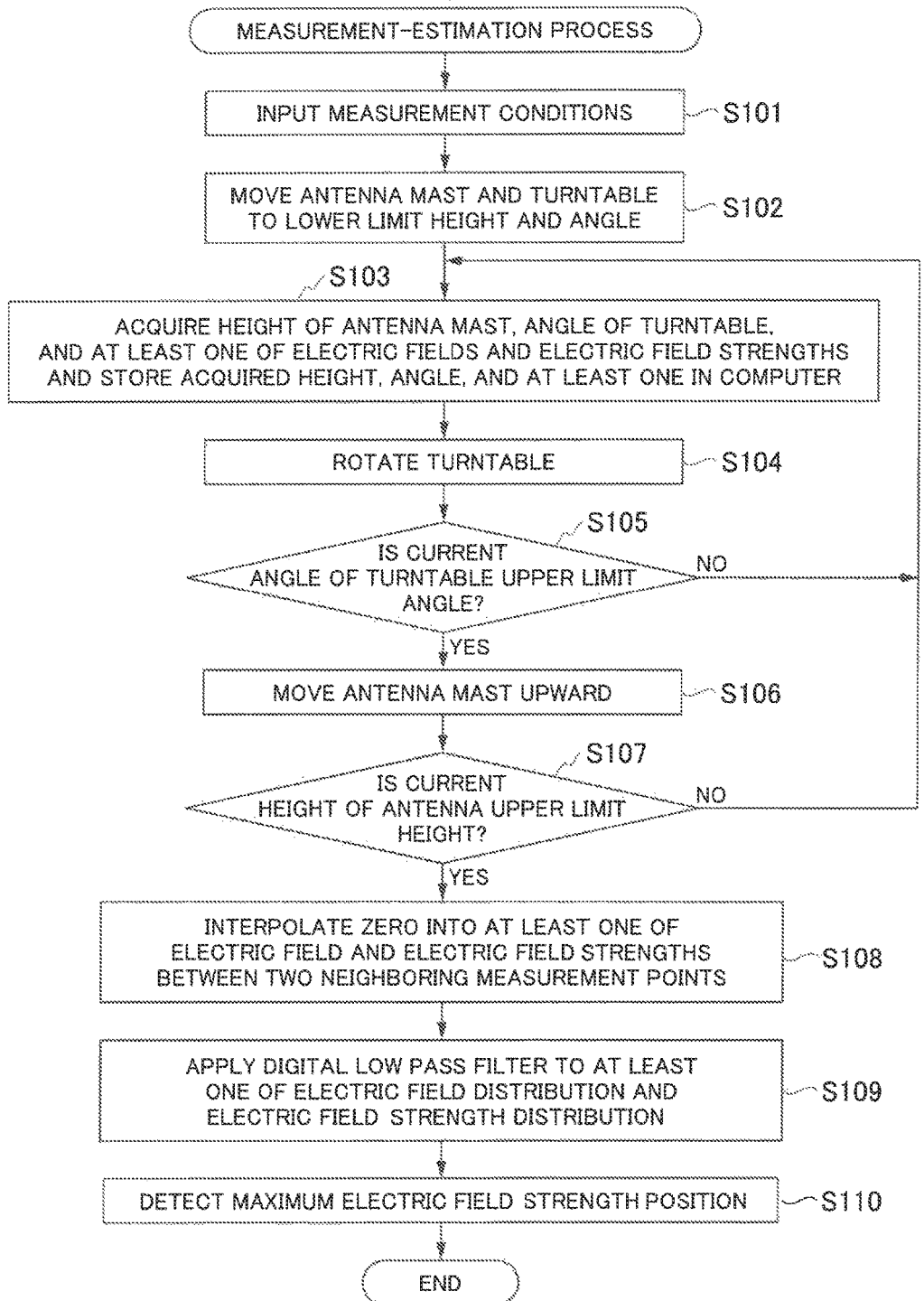
FIG. 4 is a flowchart showing a flow of an operation of the radiated emission measuring device related to the embodiment of the present invention.

Hereinafter, a series of operations of a method of estimating a maximum electric field strength position performed using the interfering wave measuring device 100 will be described with reference to a flowchart showing a flow of a measuring and estimating technique of FIG. 4.

In Step S101, an operator inputs measurement conditions such as a measuring frequency, a distance from the radiation source 1 to a receiving antenna (a measurement point) 2 in a horizontal direction, a range of measurement point heights, an increment size of measurement heights set within the range of the heights, a range of angles of rotation of the radiation source 1, and an increment size width of measurement angles set within the range of the angles to the computer 7. The increment size of the measurement heights is preferably set to ½ or less of a wavelength of a measuring frequency. Furthermore, the increment size of the measurement angles is preferably set such that a moving distance of the radiation source 1 relative to a measurement point 2 is set to be ½ or less of the wavelength of the measuring frequency.

Note that, in this embodiment, a change in the measurement height (movement of the receiving antenna 2 in a height direction thereof) is performed through the antenna mast 3 and a change in the measurement angle (rotation of the radiation source 1) is performed through the turntable 4.

In Step S102, the controller 8 performs an operation of moving the antenna mast 3 and the turntable 4 to a height of a lower limit and an angle of a lower limit in a measurement range set in Step S101.

In Step S103, the controller 8 performs an operation of acquiring information of a current height of the antenna mast 3 and a current angle of the turntable 4 from the adjusting unit 6 and an operation of measuring at least one of electric fields and electric field strengths with a measuring instrument 5 and acquiring measured values. Furthermore, the information is stored in the storage device 13 of the computer 7.

In Step S104, the controller 8 performs an operation of rotating the turntable 4 in the increment size of the angles set in Step S101.

In Step S105, the controller 8 performs an operation of acquiring current angle information of the turntable 4 from the adjusting unit 6. Furthermore, the arithmetic processing unit 9 performs an operation of determining whether the current turntable angle is an upper limit angle of the measurement range set in Step S101. When the current turntable angle is not the upper limit angle, a process returns to Step S103. When the current turntable angle is the upper limit angle, the process proceeds to Step S106.

In Step S106, the controller 8 performs an operation of moving the antenna mast 3 upward in the increment size set in Step S101.

In Step S107, the controller 8 performs an operation of acquiring current height information of the antenna mast 3 from the adjusting unit 6. Furthermore, the arithmetic processing unit 9 performs an operation of determining whether the current antenna height is the same as the upper limit height of the measurement range set in Step S101. When the current antenna height is not the upper limit height, after the turntable 4 is caused to be moved to a lower limit angle in the measurement range set in Step S101, the process returns to Step S103. When the current antenna height is the same as the upper limit height, the process proceeds to Step S108.

In Step S108, the arithmetic processing unit 9 performs an operation of creating and reading at least one of an electric field distribution and an electric field strength distribution at at least one of heights and angles measured in Step S103 to Step S107 from the storage device 13. Furthermore, the arithmetic processing unit 9 performs an operation of interpolating (inputting) zero to at least one of electric fields and electric field strengths at a certain point located between two neighboring measurement points at a (predetermined) frequency to be measured. Note that one arbitrary point or a plurality of arbitrary points may be set between the above-described two neighboring measurement points.

In Step S109, the arithmetic processing unit 9 performs an operation of applying a digital low pass filter in which a cutoff frequency is the frequency to be measured to at least one of the electric field distribution and the electric field strength distribution into which zero has been interpolated in Step S108.

In Step S110, the arithmetic processing unit 9 performs an operation of specifying a maximum electric field strength position from at least one of the electric field distribution and the electric field strength distribution obtained in Step S109.

When there are a plurality of frequencies to be measured, Step S101 to Step S110 are repeatedly performed so that maximum electric field strength positions for the frequencies can be specified. Alternatively, in Step S103, after frequency characteristics of at least one of the electric fields and the electric field strengths are acquired from the measuring instrument 5 and the information is stored in the computer 7, Step S108 to Step S110 are repeatedly performed for every frequency so that maximum electric field strength positions for the frequencies can be specified.

Thus, even if large increment sizes are set for the measurement points, sufficient data for identifying the maximum electric field strength positions can be acquired. Therefore, the number of measurement points necessary for acquiring the maximum electric field strength positions can be significantly reduced. Thus, the maximum electric field strength positions can be specified in a short period of time regardless of the skill of a measurement engineer.

For example, when maximum electric field strength positions are specified at an interval of a height of 1 cm and an interval of an angle of 1° in a range of a frequency of 300 a measurement distance of 3 m, an antenna height of 1 m to 4 m, and a test sample angle of 0 to 360°, if the above-described radiated emission measuring method of the embodiment is used, the maximum electric field strength positions can be specified with ¹/₄₇₅ of the number of measurement points as in a case in which an electric field is actually measured at an interval of a height of 1 cm and an interval of an angle of 1° and the maximum electric field strength positions are specified.

Figure 5:
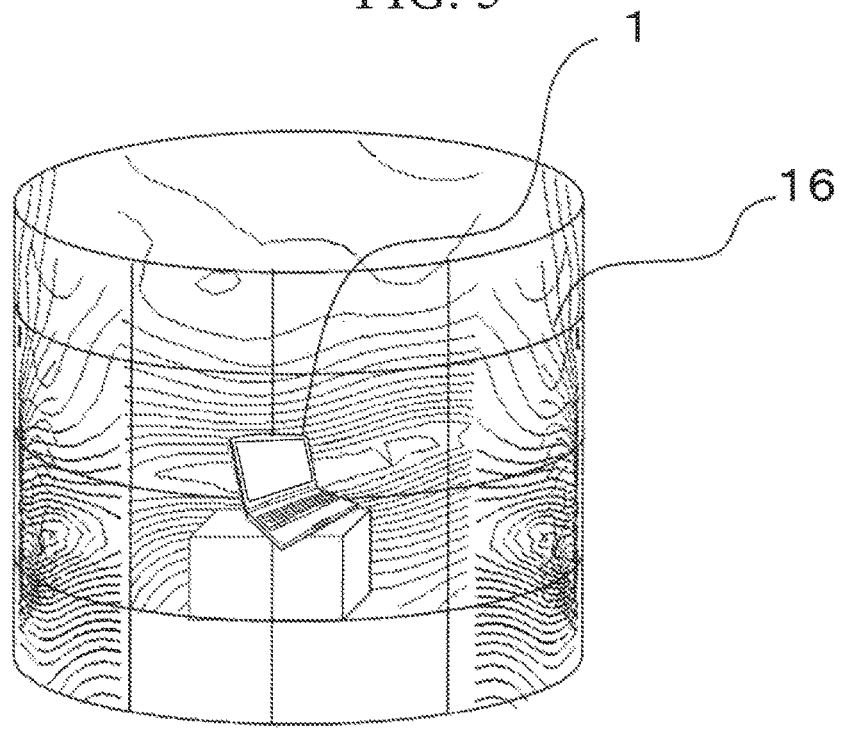
FIG. 5 is an explanatory diagram showing an outline of a method of estimating a maximum electric field strength position of the radiated emission measuring device related to the embodiment of the present invention.
Figure 6:
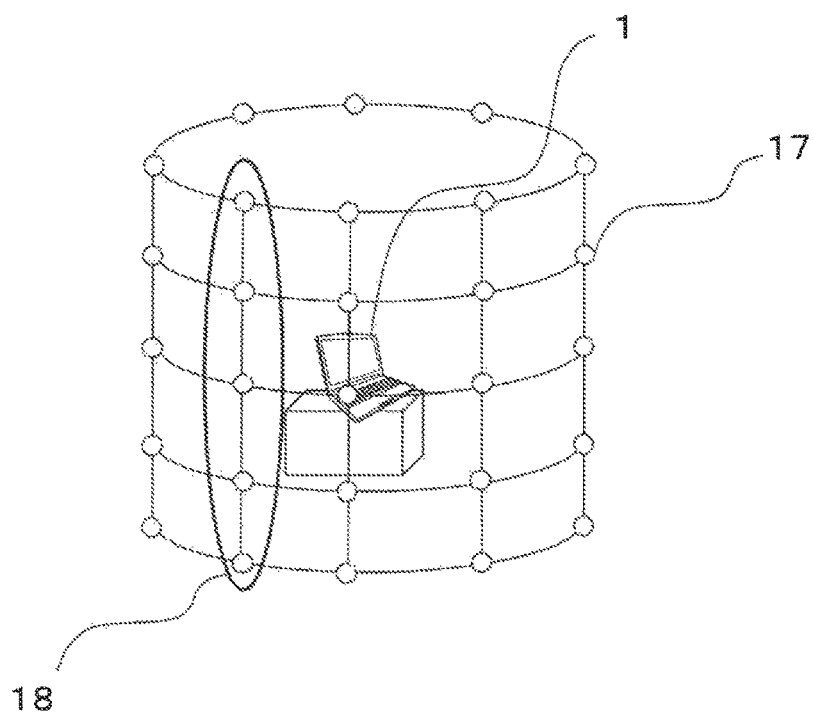
FIG. 6 is an explanatory diagram showing a plurality of measurement points in the method of estimating the maximum electric field strength position of the radiated emission measuring device related to the embodiment of the present invention.

Hereinafter, a method of estimating a maximum electric field strength position using the radiated emission measuring device of this embodiment will be described in detail with reference to the drawings. FIG. 5 is an explanatory diagram showing an outline of the method of estimating the maximum electric field strength position. FIGS. 6 to 8 are explanatory diagrams showing an example of a procedure of the method of estimating the maximum the electric field strength.

As shown in FIG. 5, the method of estimating the maximum the electric field strength related to this embodiment is an estimating technique of acquiring a position at which a maximum electric field strength is obtained within an electric field distribution 16 formed on a virtual surface surrounding the radiation source 1 using the radiation source 1 of the electromagnetic waves. The estimating technique for the maximum electric field strengths related to this embodiment is used for a test in which radiated emissions radiated from the radiation source 1 are measured, for example, according to an electromagnetic compatibility (EMC) standard.

The method of estimating the maximum electric field strength position related to this embodiment includes the following first to fourth procedures. The first to fourth procedures will be described with reference to FIGS. 6 to 8. The first procedure corresponds to Step S101 to Step S107 of the operation of the interfering wave measuring device 100. The second procedure corresponds to Step S108 of the operation of the interfering wave measuring device 100. The third procedure corresponds to Step S109 of the operation of the interfering wave measuring device 100. The fourth procedure corresponds to Step S110 of the operation of the interfering wave measuring device 100.

As shown in FIG. 6, in the first procedure, a plurality of measurement points 17 are set on the virtual surface surrounding the radiation source 1 and at least one of an electric field distribution and an electric field strength distribution of a (predetermined) frequency to be measured are measured. At this time, a distance between two neighboring measurement points 17 in the height direction and the circumferential direction on the virtual surface surrounding the radiation source 1 is preferably ½ or less of the wavelength of the frequency to be measured.

In the second procedure, zero is interpolated into at least one of electric fields and electric field strengths at points located between two neighboring measurement points in at least one of the electric field distribution and the electric field strength distribution of the frequency to be measured. At this time, one point or a plurality of points at which zero is interpolated can be provided. Furthermore, a measurer can arbitrarily set measurement points, points at which zero is interpolated, and an interval between points at which zero is interpolated. FIG. 7 is an explanatory diagram showing the second procedure, and shows an example of an electric field strength distribution constituted of electric field strengths 19 at the measurement points and electric field strengths 20 at points at which zero has been interpolated at an interval of 0.25 m between two neighboring measurement points in a range 18 of the measurement points shown in FIG. 6. In other words, zero is interpolated at two points between two neighboring measurement points in FIG. 7.

In the third procedure, a digital low pass filter in which a frequency to be measured is a cutoff frequency is applied to at least one of the electric field distribution and the electric field strength distribution obtained in the second procedure. At least one of the electric field distribution and the electric field strength distribution into which zero has been interpolated may have a component with a frequency higher than the measured frequency. However, at least one of the electric field distribution and the electric field strength distribution is actually subject to bandwidth limitation at the frequency to be measured using Expression (1). Therefore, a low pass filter in which a cutoff frequency is the frequency to be measured is applied so that a high frequency component occurring through zero interpolation can be removed, and thus at least one of an actual electric field distribution and an actual electric field strength distribution can be reproduced. An operation from the zero interpolation to the application of the low pass filter is performed so that at least one of the electric field and the electric field strengths between two neighboring measurement points is subject to interpolation. FIG. 8 is an explanatory diagram showing the third procedure, and for example, shows electric field strengths 19 of measurement points at which the digital low pass filter has been applied to the electric field strength distribution shown in FIG. 7 and an electric field strength distribution constituted of electric field strengths 21 between two neighboring measurement points for interpolation.

In the fourth procedure, a maximum electric field strength position is specified from at least one of the electric field distribution and the electric field strength distribution obtained in the third procedure. For example, FIG. 8 is an electric field strength distribution obtained through the first to third procedures in the range of the measurement points shown in FIG. 6. A position at which the electric field strength is the highest in the range 18 is a position of 1.5 m in the obtained electric field distribution using this, and this point is specified as a maximum electric field strength position. These procedures are repeatedly performed at each of angles so that heights at which the highest electric field strength within a predetermined height range for every angle is obtained are obtained. The highest electric field strengths within a predetermined height range for every obtained angle are compared so that angles and heights at which maximum electric field strengths are obtained can be specified.

[Verification Test]

Figure 9:
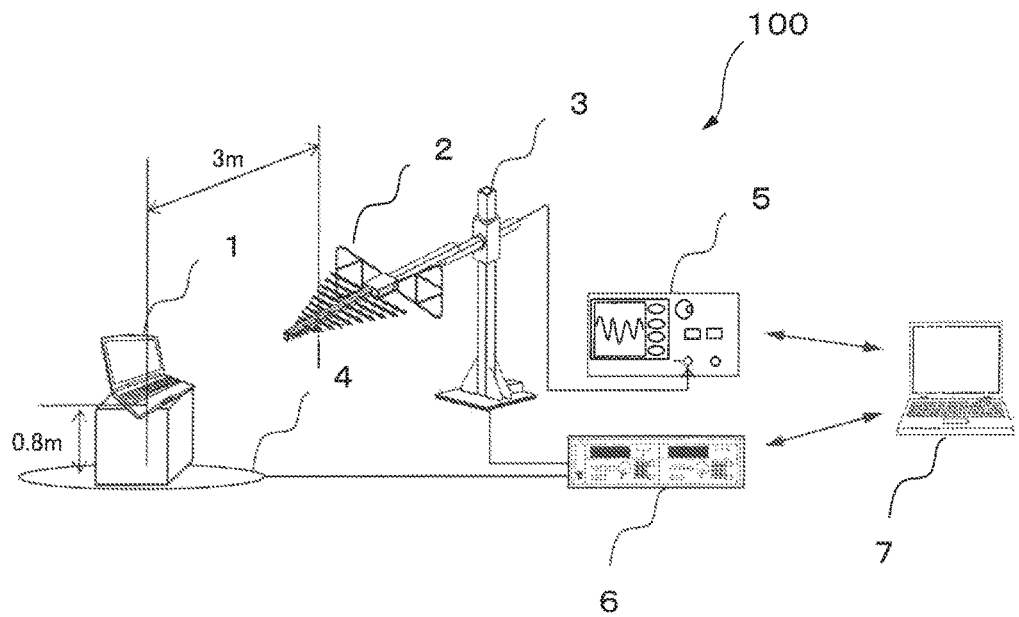
FIG. 9 is a schematic diagram of a test performed to verify validity of the method of estimating the maximum electric field strength position of the radiated emission measuring device related to the embodiment of the present invention.

Hereinafter, a test performed to verify validity of the radiated emission measuring device of the embodiment of the present invention will be described with reference to FIGS. 9 to 11. FIG. 9 is an explanatory diagram showing a method of the test. Since reference numerals of constituent elements correspond to those of FIG. 1, descriptions thereof will be omitted. The radiation source 1 is disposed at a position at a height of 0.8 m and the receiving antenna 2 is installed at a position which is 3 m away from the radiation source 1. A personal computer is used as the radiation source 1 to be measured.

Figure 10:
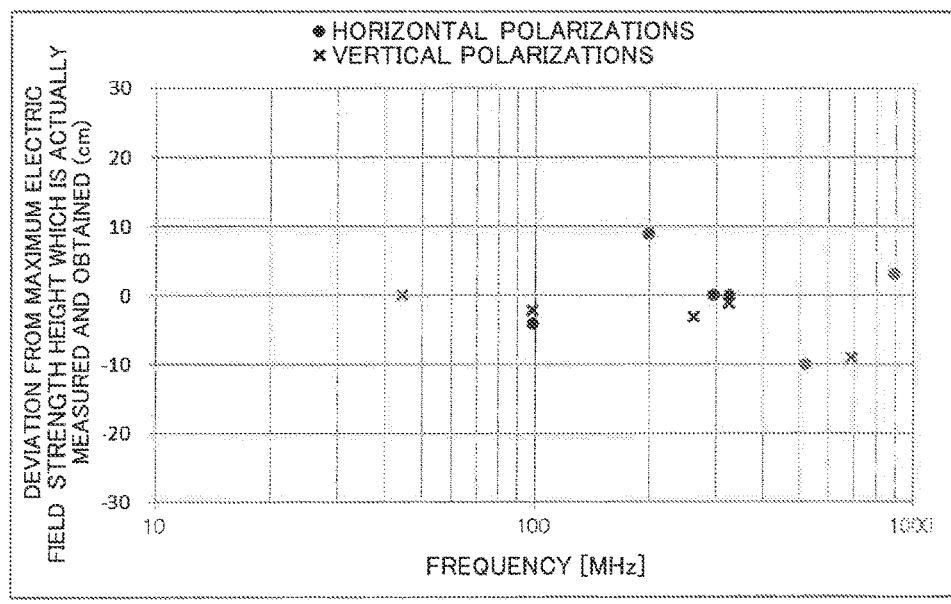
FIG. 10 is a characteristic diagram showing deviations between results obtained when the method of estimating the maximum electric field strength position of the radiated emission measuring device related to the embodiment of the present invention is performed and heights at which maximum electric field strengths actually measured and obtained are obtained.
Figure 11:
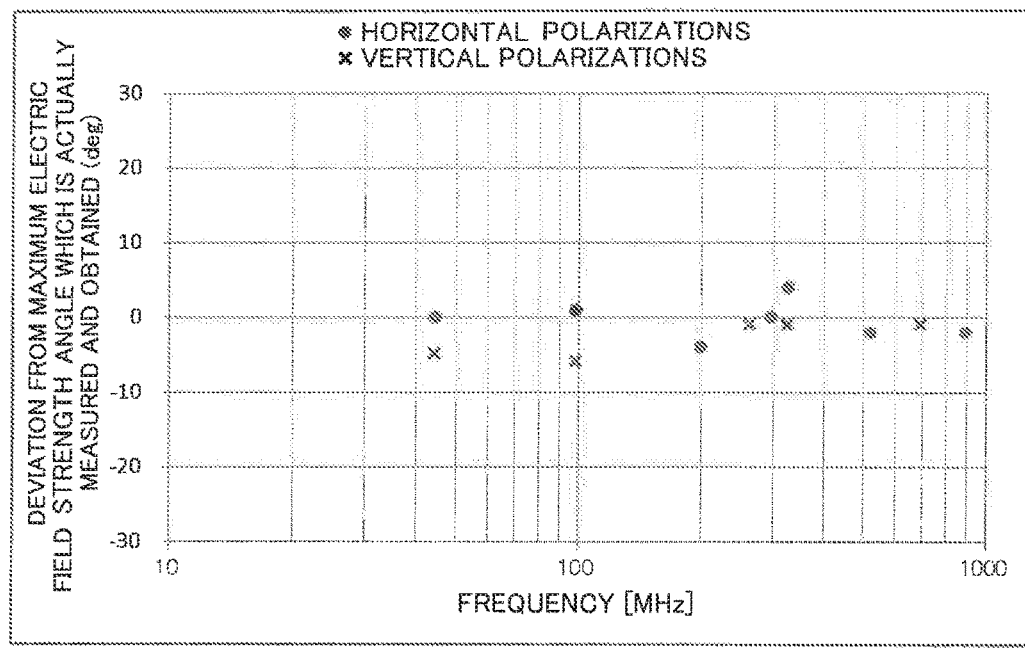
FIG. 11 is a characteristic diagram showing deviations between results obtained when the method of estimating the maximum electric field strength position of the radiated emission measuring device related to the embodiment of the present invention is performed and angles at which maximum electric field strengths actually measured and obtained are obtained.

FIG. 10 shows deviations between maximum electric field strength heights acquired through a radiated emission device 100 related to this embodiment and maximum electric field strength heights actually measured and obtained. Furthermore, FIG. 11 illustrates deviations between maximum electric field strength angles obtained through the radiated emission device 100 related to this embodiment and maximum electric field strength angles actually measured and obtained. FIGS. 10 and 11 show results of horizontal polarizations and vertical polarizations. It can be seen that the radiated emission device 100 related to this embodiment can be used so that the maximum electric field strength positions are estimated to within ±10 cm and ±10° with respect to the actually-measured-obtained positions.

While preferred embodiments of the invention have been described and shown above, it should be understood that these are exemplary examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A radiated emission measuring device configured to measure an electric field distribution of measurement points formed on a virtual surface surrounding a radiation source of electromagnetic waves, the radiated emission measuring device comprising:
an electric field measuring device and an arithmetic processing unit,
wherein the electric field measuring device comprises:
an antenna configured to detect at least one of electric fields and electric field strengths;
a position adjustment unit configured to change a position of the antenna relative to the radiation source; and
a controller configured to perform a first operation of setting a plurality of measurement points on the virtual surface and a second operation of measuring at least one of the electric fields and the electric field strengths at a frequency to be measured at the plurality of measurement points using the antenna while controlling the position adjustment unit, and
wherein the arithmetic processing unit is configured to perform:
a first arithmetic process of creating at least one of an electric field distribution and an electric field strength distribution of the plurality of measurement points measured in the second operation and inputting zero to at least one of an electric field and electric field strengths between two neighboring measurement points in at least one of the electric field distribution and the electric field strength distribution;
a second arithmetic process of applying a digital low pass filter in which the frequency to be measured is a cutoff frequency to at least one of the electric field distribution and the electric field strength distribution obtained in the first arithmetic process; and
a third arithmetic process of specifying a position at a maximum electric field strength from at least one of an electric field distribution and an electric field strength distribution obtained in the second arithmetic process.

2. The radiated emission measuring device according to claim 1,
wherein the plurality of measurement points are arranged to be disposed in two directions intersecting on the virtual surface, and a distance between two neighboring measurement points in the two directions is ½ or less of a wavelength of the electromagnetic waves.

* * * * *